(12) United States Patent
Gray

(10) Patent No.: US 6,260,171 B1
(45) Date of Patent: *Jul. 10, 2001

(54) DIGITAL DATA RECORDING CHANNEL

(75) Inventor: Martin D. Gray, La Jolla, CA (US)

(73) Assignee: Overland Data, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,351

(22) Filed: May 21, 1999

Related U.S. Application Data

(60) Division of application No. 08/988,679, filed on Dec. 11, 1997, now Pat. No. 5,931,968, which is a continuation-in-part of application No. 08/599,146, filed on Feb. 9, 1996, now Pat. No. 5,712,863.

(51) Int. Cl.[7] ................................................. G11C 29/00
(52) U.S. Cl. ............................................................ 714/771
(58) Field of Search ................................. 714/746, 752, 714/761, 763, 769, 770, 771, 787, 791, 806; 324/210, 211, 212

(56) References Cited

U.S. PATENT DOCUMENTS

| | | |
|---|---|---|
| 4,435,826 | 3/1984 | Matsui . |
| 4,559,568 | 12/1985 | Watanabe et al. ................ 360/48 |
| 4,680,791 | 7/1987 | Kato et al. ........................ 380/8 |
| 4,731,676 | 3/1988 | Berlekamp ...................... 360/26 |
| 4,744,082 | 5/1988 | Fujimura et al. ............... 370/112 |
| 4,908,826 | 3/1990 | Hertrich .......................... 371/69.1 |
| 4,978,995 | 12/1990 | Howell ........................... 341/109 |
| 4,993,029 | 2/1991 | Galbraith et al. ............. 371/40.1 |
| 5,014,274 | 5/1991 | Higurashi et al. ............ 371/40.1 |
| 5,068,878 | 11/1991 | Lin et al. ........................ 375/111 |
| 5,109,385 | 4/1992 | Karp et al. ...................... 371/42 |
| 5,172,381 | 12/1992 | Karp et al. ...................... 371/42 |
| 5,220,568 | * 6/1993 | Howe et al. ................... 714/782 |
| 5,222,139 | 6/1993 | Takaragi et al. .............. 380/28 |
| 5,325,370 | 6/1994 | Cleveland et al. ............ 714/755 |
| 5,404,377 | 4/1995 | Moses ............................. 375/200 |
| 5,629,983 | 5/1997 | Fujimoto ......................... 380/46 |
| 5,712,863 | * 1/1998 | Gray ............................... 714/806 |
| 5,931,968 | * 8/1999 | Gray ............................... 714/806 |

FOREIGN PATENT DOCUMENTS

| | | |
|---|---|---|
| 0 310 057 A2 | 4/1989 | (EP) . |
| 0 343 930 A2 | 11/1989 | (EP) . |
| 0 347 934 A2 | 12/1989 | (EP) . |
| 0 507 196 A2 | 10/1992 | (EP) . |
| 0 511 498 A2 | 11/1992 | (EP) . |
| 0 593 173 A2 | 4/1994 | (EP) . |
| 06124451 | 5/1994 | (JP) . |
| 07111047 | 4/1995 | (JP) . |
| WO 93/10534 | 5/1993 | (WO) . |
| WO 94/07332 | 3/1994 | (WO) . |

* cited by examiner

*Primary Examiner*—Trinh L. Tu
(74) *Attorney, Agent, or Firm*—Knobbe, Martens, Olson & Bear, LLP

(57) ABSTRACT

An apparatus for encoding digital data for storage on a data storage medium includes a non-deterministic randomizer code generator. The randomizer code generator may select different randomizer codes for different portions of the data to be stored. The randomizer code used to randomize a given portion of the data may be stored on the media for use in subsequent data retrieval.

5 Claims, 13 Drawing Sheets

DIGITAL DATA RECORDING CHANNEL

RELATED APPLICATIONS

This application claims priority to and is a divisional of patent application Ser. No. 08/988,679 entitled "DIGITAL DATA RECORDING CHANNEL", filed on Dec. 11, 1997 U.S. Pat. No. 5,931,968, which is a continuation-in-part of patent application Ser. No. 08/599,146 entitled "RANDOMIZING ENCODER FOR DIGITAL DATA STORAGE", now U.S. Pat. No. 5,712,863, filed on Feb. 9, 1996. The disclosures of the above mentioned issued patent and patent applications are hereby incorporated by reference in their entireties.

BACKGROUND OF THE INVENTION

1. Field of the Invention

The invention relates to magnetic recording channels. In some advantageous embodiments, the invention relates to data randomization for partial response decoding in a linear tape magnetic storage environment.

2. Description of the Related Art

Variable-rate bit insertion techniques are well known as a method for making a data stream robust against the detection of possible errors in the data stream. Typically, this method has application in the communication field, although variable rate bit insertion has been used in other applications, as is well known in the art According to this technique, data bits are inserted into selected portions of a data stream where there is an increased likelihood that an error will be made in detecting the data bits accurately at this portion of the data stream. For example, variable-rate bit insertion may be used in a communications system where the receiving decoder is self-clocked. It is important that long strings of ones or zeros be broken up so that the phase locked loop at the detector side does not lose phase lock on the clock rate at which the data is being transmitted. This is particularly important in applications involving reading, for example, from magnetic tape since tape storage media typically have a very uncertain speed profile so that frequent clocking information is preferable to maintain phase lock. Thus, in such applications where it is desirable to maintain phase lock at the reading or receiving side, data bits are intentionally inserted into "trouble regions" within the output data stream so that at the detector side, sufficient information is present in the received data signal to maintain accurate phase lock on this data signal so that the data stream can be properly decoded.

Although the method of variable-rate bit insertion is desirable as an inexpensive and fairly simple method of increasing the robustness of data against errors, such a method has typically been found to be impractical in other applications. Most notably, variable-rate bit insertion has had limited applicability in the magnetic recording environment. Magnetic recording typically involves storage onto a tape or a disk, where data is stored to the magnetic tape or disk first and then read back. To provide for robust storage of data, variable rate bit insertion might be used to encode the data before writing to the magnetic media, and when the data is read back, the inserted bits would be detected and discarded. However, since the actual number of bits which are to be inserted is highly unpredictable, it is possible that the number of bits inserted would extend the length of the data stream by as much as 10 to 12 percent. Such an extension of the data stream is unacceptable for purposes of data storage, especially when it is desirable to maximize data storage efficiency. For example, if a particular data stream has characteristics such that a bit insertion is called for every 10 bits, then the amount of data to be stored onto the magnetic media will increase by 10 percent. This effectively makes a 500-megabyte storage media into a 450-megabyte storage media.

In an effort to transform the data stream into a form that is amenable to variable-rate bit insertion, the incoming data stream is first randomized using, for example, a pseudo-random noise code which is exclusive ORed with the incoming data stream to give the resulting output a random or pseudo-random character. This random character ensures that the probability of a data stream of being extended by more than 1 percent, for example, is statistically negligible. This is because bit insertion is typically performed to break-up regular patterns so that a substantially random pattern will require very few bit insertions. Thus, by randomizing the data before applying the variable-rate bit insertion techniques, such techniques can be more readily applied in applications involving data storage on magnetic or other data storage media.

It has been found, however, that in certain instances, when the incoming data pattern has a characteristic that correlates with the pseudo-random code in such a way as to produce undesirable encoded characteristics (e.g., long strings of ones or zeros, or other redundant patterns), the randomization of the data stream using that particular pseudo-random code does not act to prevent the length of the inserted data bits from being prohibitively long. A data stream having this characteristic is typically referred to as a degenerate pattern. Thus, when the incoming data stream is degenerate, variable-rate bit insertion techniques are not practical for use with magnetic storage or other data storage media Furthermore, simply the possibility of such a degenerate data pattern has generally been considered as an impediment to the use of variable-rate bit insertion in the data storage environment.

In addition to the aforementioned shortcomings of variable-rate bit insertion in the data storage applications, it has been found that conventional techniques of variable-rate bit insertion do not always ensure that errors on the receive side associated with loss of phase information and automatic gain control are alleviated. For instance, if a detected data stream has characteristics such that a maximum swing in amplitude is not observed for a long period of time, this can cause the automatic gain control at the detection side to lose tracking, thereby introducing amplitude errors into the detected signal. Furthermore, loss of phase lock may result from data patterns other than consecutive strings of zeros and ones. Accordingly, simply inserting a bit in long strings of zeros and ones does not ensure that phase lock will be maintained in a self-clocking system at the decoding side. Thus, a need exists for an improved data encoding method which resolves the difficulties associated with variable-rate bit insertion in data storage applications and also accounts for receive-side errors associated with miscalibration of the automatic gain control or phase lock loop.

SUMMARY OF THE INVENTION

The invention includes apparatus for digital data storage. In one embodiment, a magnetic recording apparatus comprises a segment of magnetic tape, wherein the segment comprises one or more recording tracks extending longitudinally along the segment of magnetic tape, and wherein at least one of the one or more recording tracks has stored thereon a plurality of non-deterministically selected data randomizer codes.

In another embodiment, a tape drive comprises a data encoder comprising a non-deterministic randomizer code generator. The tape drive also comprises a recording head having read and write portions, wherein the write portion is coupled to an output of the data encoder. The tape drive further comprises a partial response decoder coupled to an output of the read portion of the recording head.

Another data storage system embodiment comprises a tape drive; a tape cartridge configured to be written to and read from by the tape drive, means for non-deterministically generating randomizer codes for randomizing data to be written to the tape cartridge by the tape drive, and means for writing the randomizer codes to the tape cartridge.

BRIEF DESCRIPTION OF THE DRAWINGS

FIG. 2 is a simplified block diagram that illustrates the main functional elements of the randomizer/bit insertion encoder of FIG. 1a.

DETAILED DESCRIPTION OF THE PREFERRED EMBODIMENT

Figure 1A:
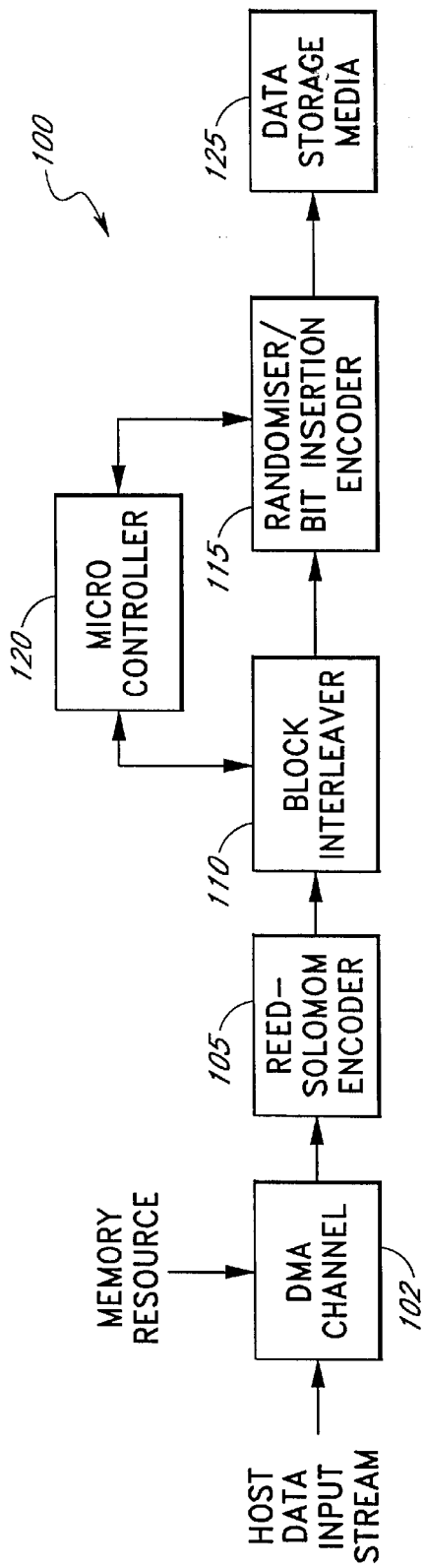
FIGS. 1a and 1b are overall system diagrams that illustrate exemplary embodiments of a data encoder and a data decoder system, respectively, for coding data to be stored on a data storage media and decoding data which is read from the data storage media.

FIG. 1a is a highly simplified schematic block diagram that illustrates an exemplary data encoder system for use in encoding a data input stream for storage on a data storage media It will be appreciated that the present invention finds application in many different data storage environments. Some specific examples include magnetic disk and tape drives. Capacity and throughput in linear magnetic recording environments, wherein the data is stored on one or more tracks which extend longitudinally along the tape segment, are especially improved with the present invention over currently used linear tape techniques. Thus, in one specific embodiment described in more detail below, the present invention is advantageously applied to linear magnetic tape drives and their associated tape and tape cartridges. Due to the advantages provided in terms of data storage capacity and throughput, tape libraries containing multiples of such linear tape cartridges and drives find dramatic improvement with the application of principles of the present invention.

As depicted in FIG. 1a, the system 100 includes a Reed-Solomon encoder 105, which receives the data input stream from a direct memory access (DMA) channel 102, which manages the flow of data in and out of the shared memory resources. Reed-Solomon encoding is well known in the art, and will not be described in detail herein. Furthermore, it will be appreciated by those of ordinary skill in the art that the data input stream need not be encoded by a Reed-Solomon encoder. In practice, other forms of error encoding, such as trellis encoding, convolutional encoding, etc., may be used in the system of FIG. 1a as called for by the specific application. Once the data has been Reed-Solomon encoded within the Reed-Solomon encoder 105, the data is block interleaved within a block interleaver 110. As is well known in the art, a block interleaver typically comprises a matrix wherein the data stream is fed in by rows and read out by columns. By block interleaving the encoded data, errors which occur during a deep fade (i.e., when a long succession of data is lost due to Rayleigh fading effects) are distributed in smaller chunks throughout a larger portion of the data input stream so that within any given region, errors in the data are more likely to be recoverable. Once the data has been block interleaved, the data are input to a randomizer/bit-insertion encoder 115. In accordance with the preferred embodiment of the present invention, the custom randomizer/bit-insertion encoder 115 randomizes the incoming data stream with a configurable pseudo-random code, and thereafter inserts data bit patterns as necessary in order to make the randomized data stream robust against well-known detection errors such as the loss of phase lock or calibration on the automatic gain control (AGC) circuit on the decoding side. The randomizer/bit-insertion encoder 115 will be described in greater detail below with reference to FIG. 2.

Once the data has been randomized and bit insertion has taken place at the appropriate "trouble spots," the data is stored onto a data storage media 125 which, for example, may comprise a magnetic disk, a magnetic storage tape, or the like. The block interleaver 110 and the randomizer/bit-insertion encoder 115 both operate under the control of a microcontroller 120.

Figure 1B:
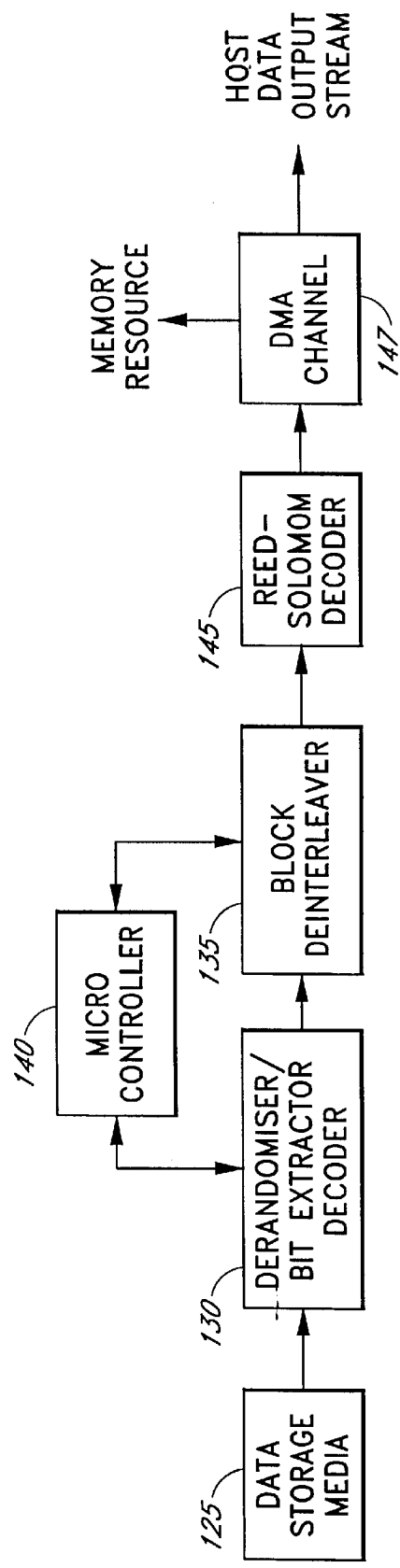

FIG. 1b is a highly simplified block diagram which shows an exemplary system used to decode data stored on the data storage media 125 when the data has been encoded by the system and method described with reference to FIG. 1a. As shown in FIG. 1b, data read from the data storage media 125 is fed into a derandomizer/bit-extractor decoder 130. The derandomizer/bit-extractor decoder 130 is described in greater detail below with reference to FIG. 3. The derandomizer/bit-extractor decoder 130 acts to essentially reverse the randomization and bit-insertion process performed within the randomizer/bit-insertion encoder 115. That is, the decoder 130 detects, extracts and discards the data bit patterns that were inserted within the encoder 115, and thereafter derandomizes the data to obtain the original data stream that was input to the randomizer/bit-insertion encoder 115.

Thereafter, the output of the derandomizer/bit-extractor decoder 130 is provided to a block deinterleaver 135, which reorders the interleaved blocks into their original order, as is well understood in the art. After the data has been deinterleaved within the block deinterleaver 135, this data is fed into a Reed-Solomon decoder 145. The Reed-Solomon decoder 145 acts to detect and correct errors within the output data stream. Once the data has been Reed-Solomon decoded, the output data stream from the Reed-Solomon decoder 145 should be a reconstruction of the data stream that was originally input to the Reed-Solomon encoder 105 for storage on the data storage media 125. A DMA channel 147 directs the flow of data to the appropriate memory resource. The derandomizer/bit-extractor decoder 130, the block deinterleaver 135, and the Reed-Solomon decoder 145 are all under the control of a microcontroller 140, which may, in one embodiment, be implemented as the same microprocessor as the microcontroller 120. In a tape drive, for example, it is most likely that microcontrollers 120 and 140 are in fact a single microcontroller that performs both the write process of FIG. 1a and the read process of FIG. 1b.

In the preferred embodiment, the microcontrollers 120, 140 enable/disable the encoder 115 and the decoder 130. Furthermore, the microcontroller monitors error status from the decoder 130 (e.g., CRC errors, insert extraction errors, etc.). The microcontroller further provides the correct randomizer seed for the encoder 115 and the decoder 130 and may optionally also monitor the encoder 115 for excessive insertions. In addition, the microcontroller creates header bytes for each block indicating address information for the Reed-Solomon decoder and the randomizer seed required for decoding. The microcontroller further invokes rewrites when a read-after-write error is detected. Finally, the microcontroller invokes a read retry when the capability of the Reed-Solomon encoder/decoder is exceeded as is well understood in the art. Each of the main operations of the microcontrollers 120, 140 will be described in greater detail below.

Figure 2:
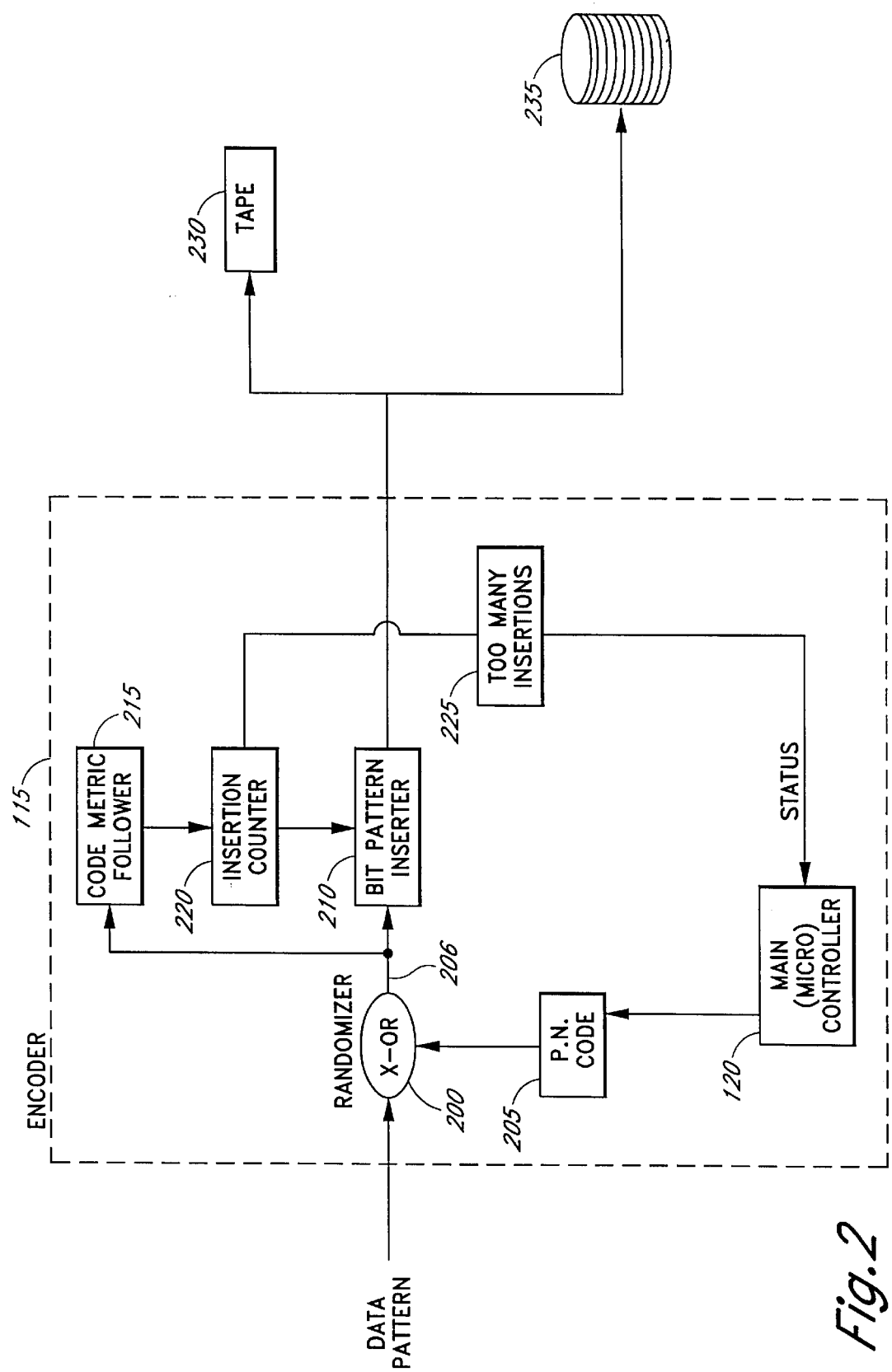

FIG. 2 is a schematic block diagram that illustrates the main functional elements of the randomizer/bit-insertion encoder 115 of FIG. 1a. As mentioned above, the write channel circuit shown in FIG. 2 may advantageously be provided in a disk or tape drive. As shown in FIG. 2, a data pattern input provided by the block interleaver 110 enters a randomizer 200. In one preferred embodiment, the randomizer 200 comprises an exclusive OR gate, which receives the input data pattern on a first input and receives a pseudo-random noise code on a second input via a second input from a pseudo-noise code generator 205. As will be described in greater detail below, the pseudo-noise code generator 205 comprises a shift register and adder configuration, which is defined by a randomizer polynomial, discussed in greater detail below. Of course, it will be appreciated that the randomization of data using a linear feedback shift register (LFSR) is well understood and conventional. The pseudo-random code generated by the LFSR is determined by both the randomizer polynomial which defines the tap positions and other aspects of the LFSR as well as by the initial state of the bits stored by the LFSR. These initial bits define a randomizer code. By setting the initial values of the pseudo-noise code generator register (i.e., the randomizer code), the pseudo-noise code that is generated by the generator 205 can be reconfigured so that the pseudo-noise code can easily be changed on the fly (e.g., in between data blocks). In one embodiment of the present invention, the randomizer code is 24 bits long, although other lengths would also be suitable.

The output of the randomizer 200 feeds to a bit pattern inserter 210. As will be explained further below, the bit pattern inserter comprises a variable rate bit inserter which inserts bits into the randomized bit stream to increase the phase and amplitude content of the data stream to reduce the read channel error rate. This bit insertion is directed by a code metric follower 215 described in more detail in conjunction with FIG. 13–13d. Although not required, in some embodiments the number of bit insertions made to the data stream is monitored by an insertion counter 220, which may provide an input to a bit-insertion threshold detector 225. When present, the bit-insertion threshold detector 225 provides a status signal to the main microcontroller 120, which in turn provides a control signal to the pseudo-noise code generator 205.

The output of the bit pattern inserter 210 is provided to the data storage media. As shown in FIG. 2, the media may comprise a magnetic tape 230 or a magnetic disk 235. It will be appreciated by those of ordinary skill in the art that the bit pattern inserter 210 is typically connected to one or the other of the data storage media 230, 235, and is not typically connected to both simultaneously. In one advantageous application of the present invention, the data stream output from the bit pattern inserter 210 is used as an input to a tape drive recording head having read and write portions. The output of the bit pattern inserter 210 would therefore modulate a write current so as to drive the write portion of the recording head to record the data on linear recording tracks onto segments of magnetic tape 230.

In operation, the data pattern from the interleaver 110 is exclusive ORed with the pseudo-noise code to produce an output data pattern on the line 206 with an essentially random data pattern distribution. As discussed briefly above, data patterns that have an essentially random characteristic (i.e., data distribution) are statistically ideal for minimizing the number of data bits which must be inserted to break up redundant patterns which increase the likelihood of a decoding error.

The randomized output over the line 206 is detected by the code metric follower 215, which determines whether or not the randomized data stream meets the three separate metric criteria defined in accordance with the present invention to minimize the likelihood of decoding error. The operation of the code metric follower 215 will be described in greater detail below with reference to FIGS. 4–7.

When the code metric follower 215 determines that a bit pattern is to be inserted within the randomizer data stream along the line 206, the appropriate bit pattern is inserted by the bit pattern inserter 210. Although, in one preferred embodiment, the bit pattern inserted comprises a four-bit word, in practice, a single bit or, alternatively, a multiple bit word (i.e., having two, three or more bits) could be inserted as called for by the specific application. The method employed by the bit pattern inserter 210 to insert the appropriate bit pattern will be described in greater detail below with reference to FIGS. 4 and 8. Once the bit pattern is inserted, the data stream passes through a storage media for permanent storage. For example, the data stream may be written to the tape 230 or to the magnetic disc 235.

In advantageous embodiments of the present invention, the randomizer code used to configure the pseudo-random code generator 205 is periodically changed in a non-deterministic manner. In these embodiments, the microcontroller 120 may be programmed to comprise a randomizer code selector which non-deterministically selects randomizer codes for use by the pseudo-random code generator 205. Alternatively, a logic circuit separate from the microcontroller 120 may be designed for the non-deterministic selection of randomizer codes. Many techniques of non-deterministic number generation are known and would be suitable for use in the invention. Any procedure creating a complex, non-repetitive pattern for choosing consecutive codes can be used, as called for by the particular application. The non-deterministic character of the selection need only be sufficient to render the prediction of a sequence of randomizer codes impractical.

Several different implementations of this feature are possible. In one embodiment, the randomizer code is non-deterministically changed for each data block written to the media, and the randomizer code used to randomize a given data block is stored in association with the data block so that it can be retrieved to de-randomize the data block when the data is later retrieved. In other embodiments, the randomizer code is only changed when the randomized data pattern being stored is requiring an excessive number of bit insertions by bit pattern inserter 210. In these embodiments, the insertion counter 220 and the bit insertion threshold detector 225 are provided. The insertion counter 220 will then keep track of the number of bit patterns which are inserted into the data stream output by the bit pattern inserter 210. If too many insertions are detected within the insertion detector 225, this causes a signal to be transmitted to the micro controller 120, in response to which the microcontroller may re-initialize the pseudo-random code generator with a new randomizer code.

Data written to either tape or disc can be encoded. In some embodiments, as data is being written to the magnetic disc 235, if the disc sector size is exceeded due to variable rate encoding of the data written to the sector, the block is truncated at the end of the sector and the sector is overwritten with the same data randomized using a different randomizer code (i.e., seed).

In this manner, not only can a data pattern be randomized to reduce the number of bit insertions made on a data stream to be stored, but the randomizer code can be reconfigured on the fly, either with each new data block or when the number of bit insertions becomes too high. In the first case, when the randomizer is changed with each data block, the coding efficiency remains high because only a statistically insignificant number of data blocks will contain a degenerate data pattern which requires a large number of bit insertions. Thus, the use of a plurality of non-deterministically variable randomizer codes will result in a bit insertion frequency which is within the allowable limits for storage on a magnetic medium.

Figure 3:
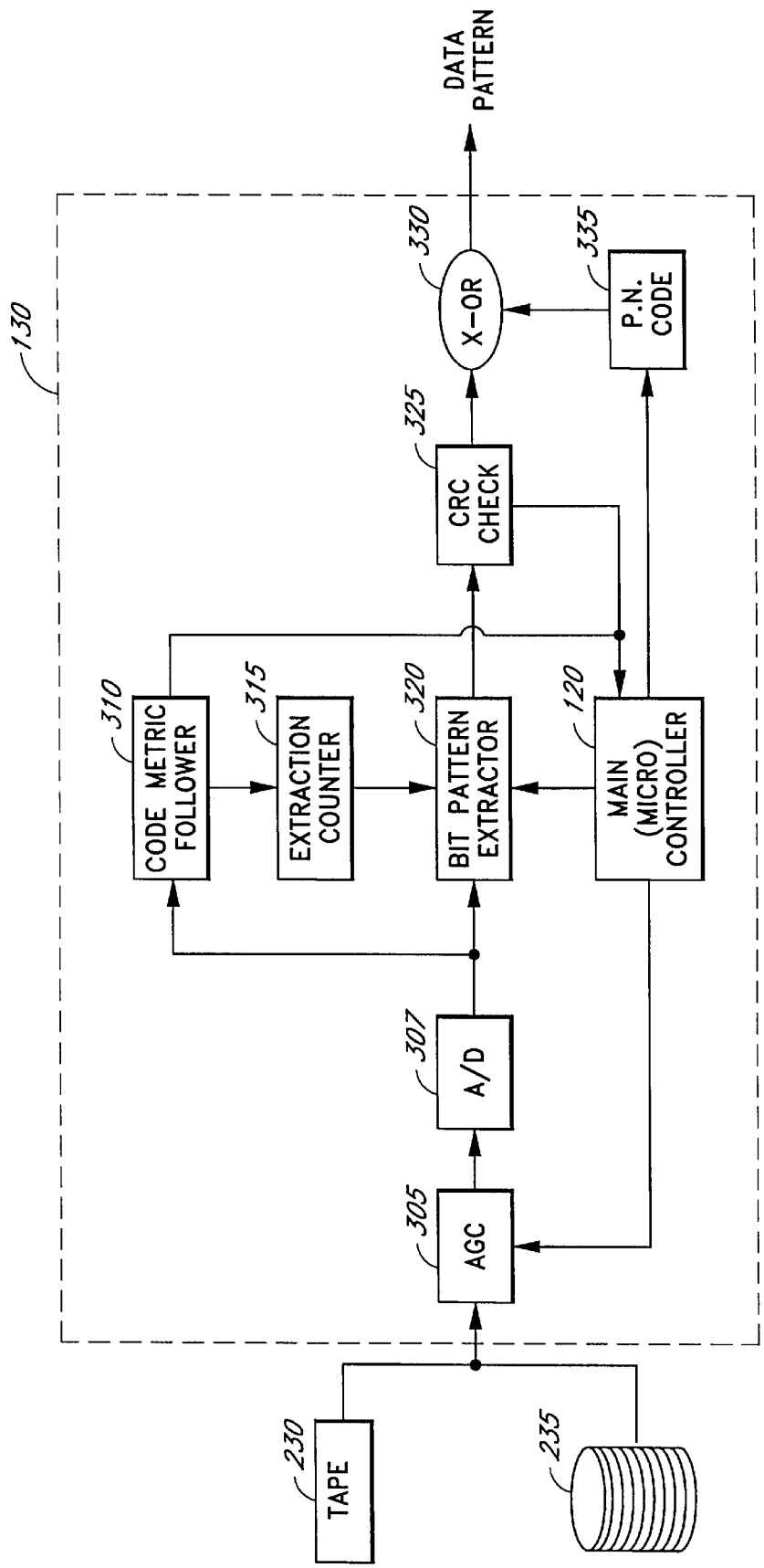
FIG. 3 is a simplified block diagram that illustrates the main functional elements of the derandomizer/bit extractor decoder of FIG. 1b.

FIG. 3 is a schematic block diagram which illustrates the main functional elements of the derandomizer/bit extractor decoder 130 of FIG. 1b. As shown in FIG. 3, data storage media such as the tape 230 or the disc 235 inputs data into an automatic gain control circuit 305 which automatically adjusts the amplitude of the incoming data stream to an appropriate level for monitoring by a code metric follower 310. Analog-to-digital conversion hardware 307 is used to restore the analog signal output of the AGC circuit 305 to the digital bit stream written to the magnetic media. In some embodiments, the A/D converter circuit 307 comprises a partial response decoder. As mentioned below with reference to FIG. 13, the decoder may be an EPR4 partial response decoder. In partial response decoding, the decoder receives an analog waveform from a read head, and determines a bit sequence most likely to have produced the analog waveform output from the read head. Partial response decoding has been applied extensively in hard disk data storage, but has not been successfully applied to linear tape data storage. With the methods and apparatus of the present invention, however, partial response decoding becomes possible even for linear tape data storage. With a non-deterministic randomizer, especially when combined with Reed-Solomon or other error correction as described above, degenerate data patterns no longer pose a statistically significant problem.

Referring back to FIG. 3, the code metric follower 310 operates in substantially the same manner as the code metric follower 215 of FIG. 2. The code metric follower 310 receives the data stream output by the A/D convertor circuit 307 and generates command signals to an extraction counter 315 as well as to the main micro controller 120. The input to the main micro controller 120 provides an indication to the micro controller 120 that a particular bit pattern detected within the data stream corresponds to an inserted bit pattern rather than to the natural bit pattern of the data. When the code metric follower in the decoder 310 detects a pattern that contains an insertion, the extraction counter 315 is notified. The extraction counter 315 removes the inserted data bits and at the same time verifies that the extracted bits are the correct polarity based upon the polarity of the previous two decoded bits, as described below with reference to FIG. 8. If the polarity is incorrect, an error status signal is generated to inform the microcontroller 140.

The bit pattern extractor 320 outputs the data stream through a cyclical redundancy code (CRC) check circuit 325. The CRC check circuit 325 verifies that the appropriate bits are extracted from the data stream and outputs a signal to the micro controller 120 if an error has been detected. When an error is detected by the CRC check circuit 325, the block is flagged as an erasure. In the subsequent Reed-Solomon decoder 145, the data which is tagged as an erasure is reconstructed using the correction capabilities provided by the Reed-Solomon decoder 145. As is well known in the art, Reed-Solomon encoding allows for error detection as well as correction. The proportion to the number of corrections to the number of detections can be varied depending upon the desired application. In the preferred embodiment of the invention, the Reed-Solomon encoder/decoder is set to perform the maximum number of corrections (i.e., to correct as many errors as are detected). This is because the detection of errors is advantageously performed using the CRC. In the event that more errors are detected than can be corrected, the microcontroller 140 requests a retransmission of the data. Once the data has been checked by the CRC check circuit 325, the data is once again exclusive ORed with the appropriate pseudo-noise code via a derandomizer circuit 330 (comprising an exclusive-OR gate in one advantageous embodiment) and a pseudo-noise code generator 335. The pseudo-noise code generator 335 receives instructions indicating which pseudo-noise code is to be used to decode a given block of data via the derandomizer 330. As described below, the information concerning which code to use for derandomization can be obtained from the header portion of the block of data, which is typically randomized using a fixed code rather than a variable code. Consequently, the same data pattern which was initially written for storage to the tape 230 or disc 235 is reproduced at the output of the exclusive-OR gate 330, and transferred to the block de-interleaver 135 (see FIG. 1b) or further processing.

Figure 4:
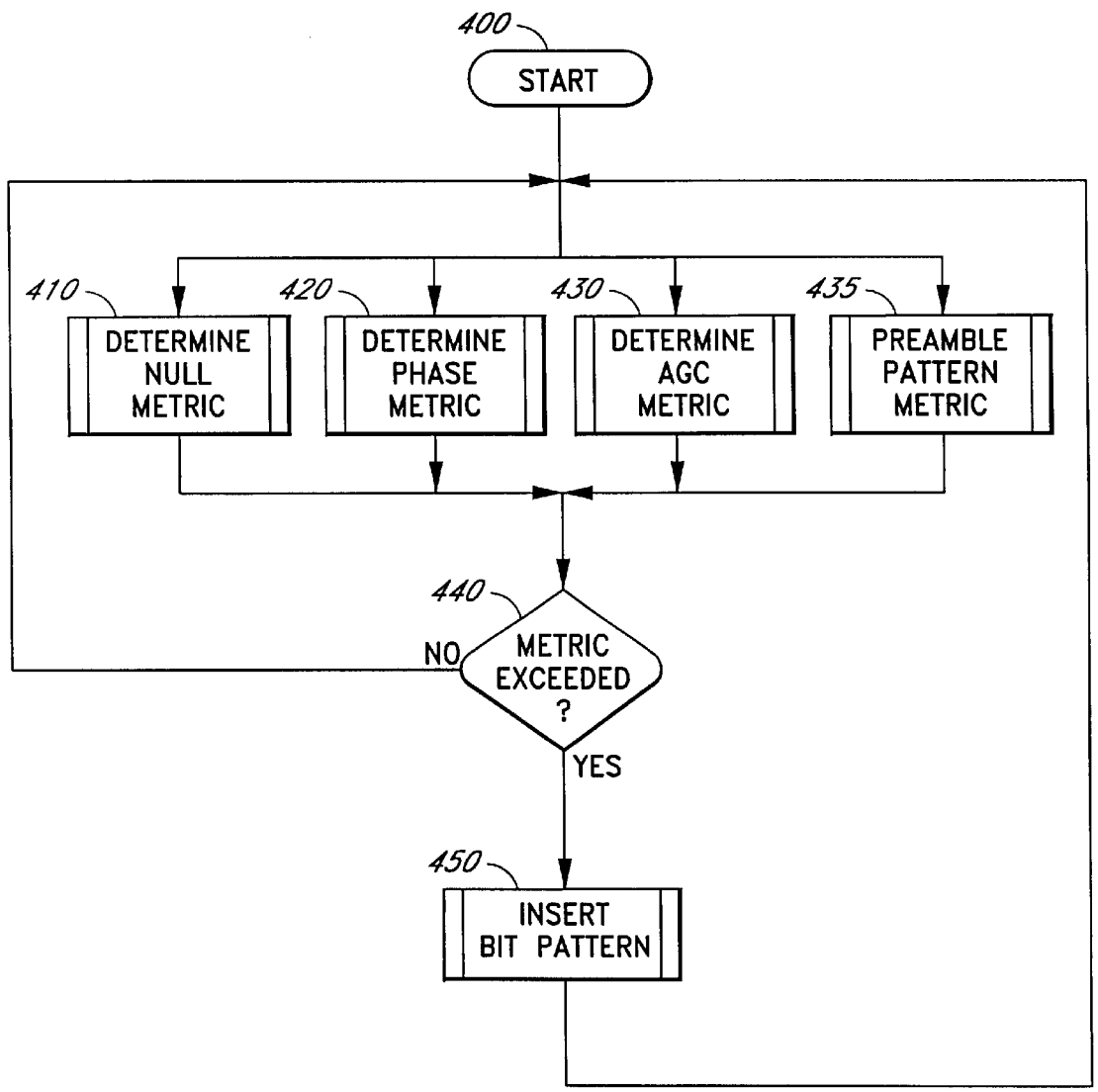
FIG. 4 is a flowchart that illustrates the general method used to insert a data bit pattern in accordance with the variable-rate encoding method of the present invention.

FIG. 4 is a flowchart that illustrates the general method used in accordance with the present invention to insert a data pattern in accordance with the variable-rate encoding method of the present invention. As depicted in FIG. 4, the method initiates, as represented by a start block 400, and enters four metric subroutine blocks 410, 420, 430, 435 for parallel processing to determine a null metric, a phase metric, an automatic gain control (AGC) metric, and a preamble pattern metric, respectively.

The null metric determined within the subroutine block 410, is used as a measure of consecutive zeros (commonly referred to as a null pattern) detected within the data stream. As discussed briefly above, when a null pattern persists within the data stream for an extended period, the effects can be deleterious on the decoding so that errors are more likely to occur. Thus, the subroutine block 410 tabulates the length of a null pattern and outputs a flag or a metric value indicative of a null pattern. The method used within the subroutine block 410 to determine the null method is described in greater detail below with reference FIG. 5.

As represented within the subroutine block 420, the phase metric of the incoming data stream is determined. The phase metric is an indication of the phase content of the data stream. As discussed briefly above, it is important for a data stream to contain adequate phase content since data decoding is based not only on amplitude, but on phase. Thus, a decoder may lose calibration if the phase content of the incoming data signal is sufficiently low that the phase decoder is unable to sufficiently recalibrate. This can result in inaccurate phase measurements made by the phase decoder. Thus, as a measure of the phase content of the incoming data stream, the subroutine block 420 outputs a phase metric value. The method employed within the subroutine block 420 is described in greater detail below with reference to FIG. 7.

As represented within the subroutine block 430, the automatic gain control (AGC) metric is determined. For purposes of accurately determining the amplitude at which the read signal should be input to the A/D converter 307 (FIG. 3), the automatic gain control circuit 305 must amplify the data stream from the magnetic media to the appropriate level. However, this AGC circuit 305 sometimes requires recalibration. This recalibration depends upon variations in the amplitude of a signal to determine the gain amplitude which the signal ought to have. Thus, it is particularly advantageous if the signal occasionally undergoes a maximum amplitude variation while reading the data pattern so that the AGC circuit 305 is able to recalibrate at the appropriate intervals. Thus, if the determination is made within the subroutine block 430 that a maximum amplitude variation has not occurred within a determined interval, then an AGC flag, or a measurement value indicating how long it has been since a maximum amplitude variation, is output by the subroutine block 430. The method employed within the subroutine block 430 to determine the AGC metric is described in greater detail below with reference to FIG. 6.

In one particularly advantageous embodiment of the invention, the code follower 215 is configured to monitor the header and data field portions of the data block in order to ensure that the preamble pattern is not reproduced outside of a preamble field. The monitoring for the preamble pattern is performed within the subroutine block 435. If it is determined that any 14 bit portion of the preamble has been reproduced elsewhere, then a flag is set which causes the bit inserter to insert a single bit at the end of this 14 bit sequence. In this case, the inserted bit is chosen to be the same as the second to last encoded bit, thereby ensuring that a preamble sequence is not recorded in the header or data fields of a block.

The metrics determined within the subroutine blocks 410, 420, 430, 435 serve as inputs to a decision block 440 which determines if any one of the null, phase or AGC metrics has been exceeded. In one advantageous embodiment, the subroutine blocks 410, 420, 430, 435 simply set flags to indicate that a metric threshold has been exceeded. If any one of the metrics has been exceeded, then a bit pattern is inserted into the data stream to compensate for the "trouble spot," as represented within a subroutine block 450 (see FIG. 8). However, if it is determined within the decision block 440 that the metric has not been exceeded, then the method returns to the inputs of the subroutine blocks 410, 420, 430, 435. The appropriate metric values are reset at the beginning of each new block of data.

Figure 5:
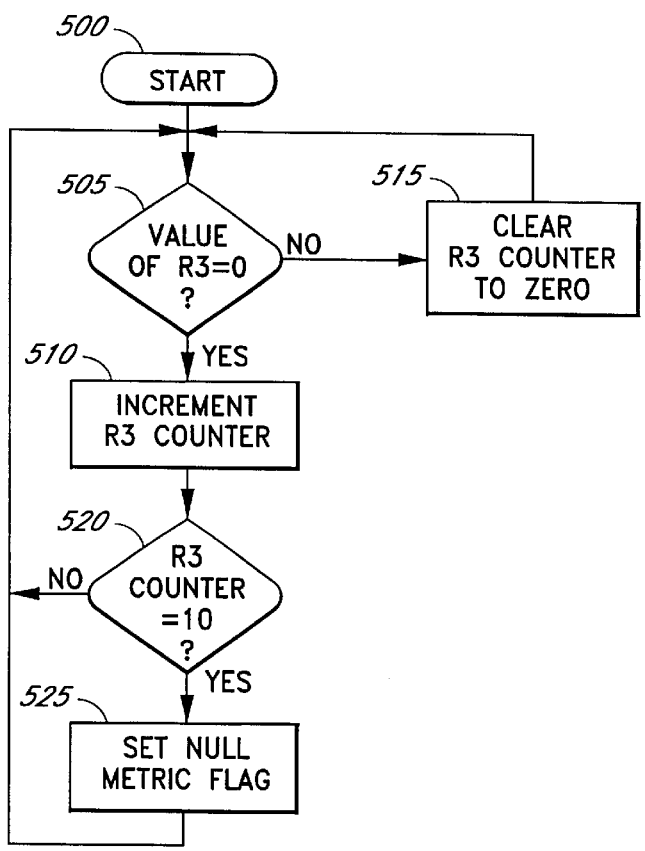
FIG. 5 is a flowchart that illustrates a submethod used to determine the null metric within the null metric subroutine block of FIG. 4.
Figure 12:
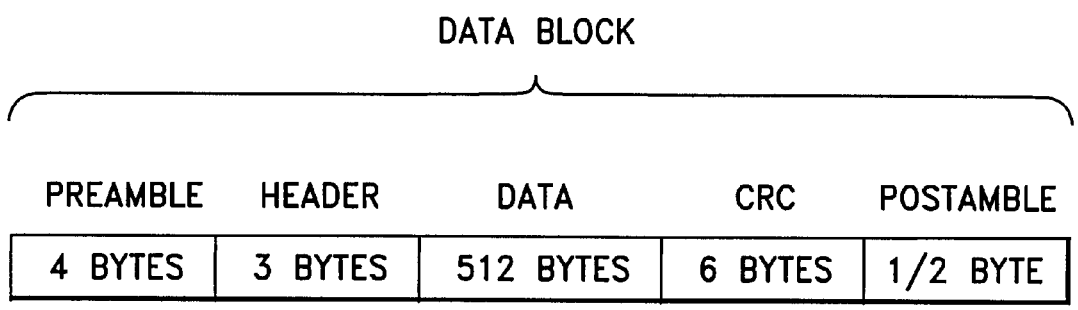
FIG. 12 schematically illustrates the format of a data block in one preferred embodiment of the invention.

FIG. 5 illustrates a flow chart of the submethod used to determine the null metric within the null metric subroutine block of FIG. 4. The submethod begins as represented within a start block 500, and a determination is made if the value stored within register $R_3$ of the register-implemented impulse response simulator of FIG. 12 is equal to 0. As will be described in greater detail below with reference to FIGS. 12 through 12d, the impulse response of the read head used to read data from the magnetic storage media is simulated as a means of estimating the null, phase and AGC metrics. The value contained within the register $R_3$ is indicative of the duration of a null pattern so that the value contained within the register $R_3$ can be used to determine whether or not a bit pattern must be inserted to break up a null pattern.

If it is determined that the value contained within the register $R_3$ is equal to 0, as represented within the decision block 505, then a counter (i.e., an $R_3$ counter) is incremented, as represented within an activity block 510. However, if it is determined within the decision block 505 that the value stored within the register $R_3$ is not equal to 0, then the $R_3$ counter is cleared to 0, as represented within an activity block 515, and the method returns to the decision block 505.

Once the $R_3$ counter has been incremented, a further test is performed, as represented within a decision block 520, to determine if the value stored within the $R_3$ counter is equal to 10. If the value stored within the $R_3$ counter is not yet equal to 10, then this indicates that the null pattern is not sufficiently long to merit insertion of a bit pattern. However, if it is determined that the value stored within the $R_3$ counter is equal to 10, then this is an indication that the null pattern is of a sufficient length to require insertion of a bit pattern to break up the null pattern. Thus, if the value stored within the $R_3$ counter is less than 10, the method returns to the decision block 505; however, if the value stored within the $R_3$ counter is equal to 10, then a null metric flag is set to indicate that a bit pattern is to be inserted by the bit pattern inserter 210, as represented within an activity block 525. Once the null metric flag has been set, as represented within the activity block 525 this indicates that an insertion will be made. The $R_3$ counter will then be automatically cleared to 0 when the inserted bit pattern is detected since this will cause $R_3$ to set to a non-zero value. The method then returns to monitor the value stored within the register $R_3$.

Figure 6:
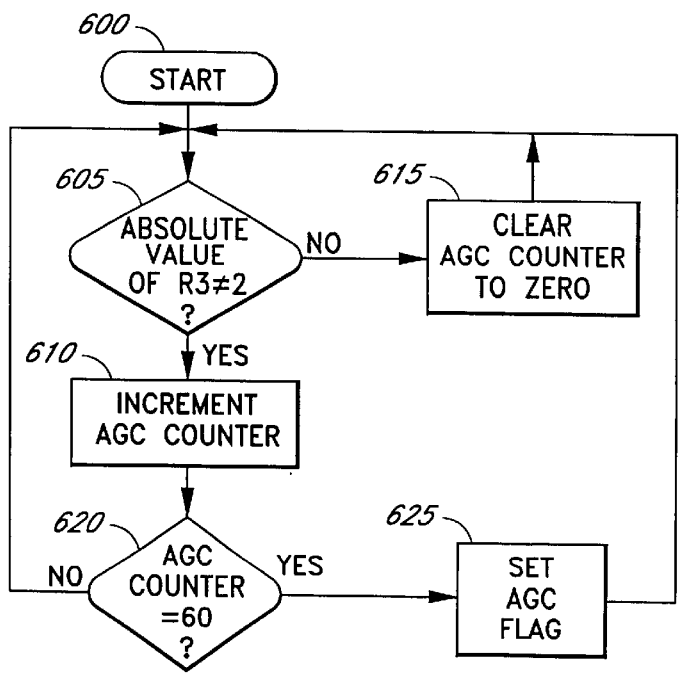
FIG. 6 is a flowchart that illustrates the general method used in accordance with the invention to determine the automatic gain control metric within the gain control metric subroutine block of FIG. 4.

FIG. 6 is a flow chart which illustrates a general method used in accordance with the present invention to determine the automatic gain control metric within the gain control metric subroutine block of FIG. 4. The method begins, as represented within a start block 600, and a test is performed to determine if the absolute value stored within the register $R_3$ is not equal to 2, as represented within a decision block 605. As will be discussed in greater detail below, the value stored within the register $R_3$ may be used as a measure of read amplitude. Thus, if the absolute of the register $R_3$ is not equal to 2, then this indicates that the read amplitude has not exhibited a maximum variation in the positive or negative directions. Thus, there is a danger that the automatic gain control will be unable to accurately calibrate, since a maximum amplitude variation has not been observed by the automatic gain control circuitry. For this reason, the method of FIG. 6 keeps track of the number of clock cycles which transpire between maximum amplitude variations. To accomplish this, an automatic gain control counter is incremented, as represented within an activity block 610. However, if it was determined within the decision block 605 that the absolute value stored within the register $R_3$ was equal to 2, then this indicates that a maximum amplitude variation has been observed by the AGC circuitry so that the AGC counter is cleared to 0, as represented within an activity block 615. From the activity block 615, the method returns to the decision block 605, where the read amplitude is again monitored.

Once the AGC counter has been incremented, as represented within the activity block 610, a determination is made, as represented within a decision block 620, if the AGC counter has incremented up to a value of 60. A value of 60 stored within the AGC counter indicates that 60 clock cycles have transpired since the last maximum variation in amplitude, and it has been found that this number of clock cycles is a convenient number at which to insert an appropriate bit pattern for purposes of recalibrating the automatic gain control circuitry. Thus, as depicted in FIG. 6, if the AGC counter increments to a value of 60, then an AGC metric flag is set to indicate that the appropriate bit pattern is to be inserted, as represented within an activity block 625. If the AGC counter is not yet incremented to a value of 60, then the method returns to the decision block 605 to continue monitoring read amplitude variations via the value stored within the register $R_3$.

As will be described in greater detail below with reference to FIG. 8, in order to determine which bit pattern will be inserted into the data stream, as indicated within the activity block 625, the 2 bits within the data stream prior to the inserted bit pattern are monitored, and a bit pattern is selected in order to ensure that the combination of the input bit pattern and the prior 2 data bits in the data stream cooperate to produce a maximum amplitude variation. Once the AGC null metric flag has been set, this will cause the insertion of a bit pattern which will subsequently clear the AGC counter to 0, as represented within the activity block 615. In the meantime, the method resumes monitoring the simulated read amplitude.

Figure 7:
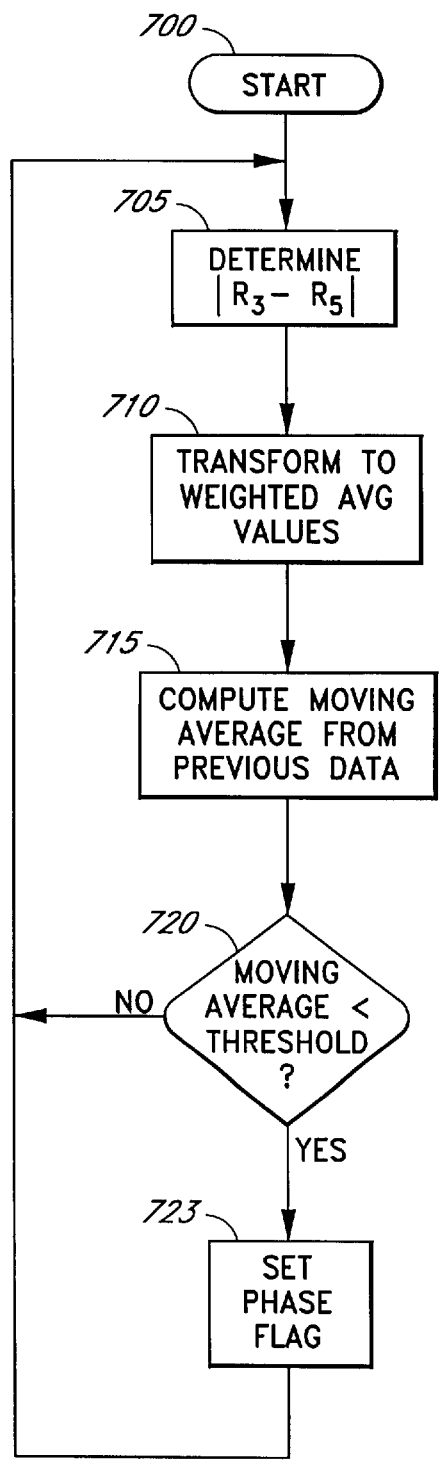
FIG. 7 is a flowchart that illustrates the method used in accordance with the present invention to determine the phase metric within the phase metric subroutine block of FIG. 4.

FIG. 7 is a flow chart which illustrates the method used in accordance with the present invention to determine the phase metric within the phase metric subroutine block of FIG. 4. The method initiates, as represented within a start block 700, and the absolute value of the difference between the value stored within the register $R_5$ and the $R_3$ of FIG. 12 is calculated, as represented within an activity block 705.

Thereafter, the value calculated within the activity block 705 is transformed into a weighted average value, as represented within an activity block 710. Since, in the embodiment described herein, the value calculated within the activity block 705 may be 0, 1, 2, 3 or 4, then the corresponding weighted average values are 0, 2, 4, 6 and 8. For example, if the value calculated within the activity block 705 is 3, then this value will be transformed to a value of 6 within the activity block 710, while if the value calculated within the activity block 705 is 4, then this value will be transformed to a value of 8 within the activity block 710.

Thereafter, as represented by an activity block 715, a moving average is computed from the weighted average values calculated for the all of the bits starting from the preamble of the data block which have been monitored for phase content. This moving average is recalculated each time a new value is calculated within the activity block 705. Advantageously, at the beginning of each data block, the average value is set to some number indicating near maximum phase content. As the moving average is calculated this value varies as determined by the actual phase content of the data stream. If this moving average falls beneath a certain threshold value, then this indicates that the data stream has a very low phase content, so that a bit pattern should be inserted to improve phase calibration. The reason for this is that the value stored within the register $R_5$ is a time delayed version of the value stored within the register $R_3$. Thus, the difference between the values stored within the register $R_5$ and $R_3$ is a measure of the rate of change of the data stream at a sample time corresponding to the value stored within the register $R_4$. Thus, this differential value measures the phase content so that from this differential value, an indication can be made as to whether or not a bit pattern needs to be inserted in order to increase the phase content of the data stream.

Once the moving average has been calculated, a determination is made if this moving average is less than the threshold value, as represented within a decision block 720. In one advantageous embodiment the threshold value is greater for the header field than for the data field (see FIG. 11), however, the actual values used for these threshold values may vary from application to application and may be determined as called for by the particular implementation. A phase metric flag is then set as represented within an activity block 723, and the method returns to monitor for phase content. In this manner, when a lack of phase content is detected within the data stream, a flag is set which causes a bit pattern to be inserted in order to increase the phase content of the data stream. However, if the moving average is above the threshold value, then the method reenters the activity block 705 to determine the next difference value.

Figure 8:
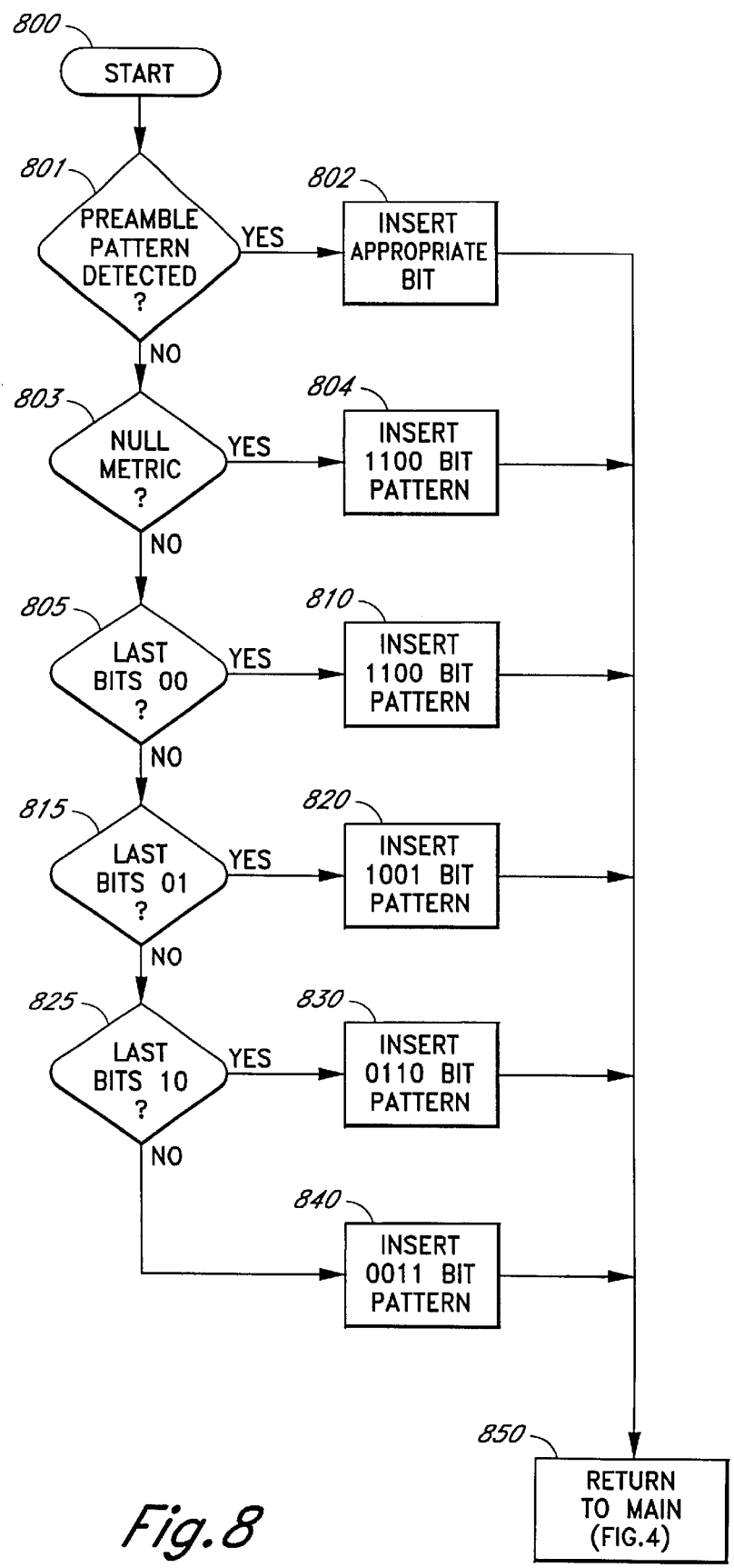
FIG. 8 is a flowchart that illustrates the submethod used within the insert bit pattern subroutine block of FIG. 4 to select and insert the appropriate bit pattern into the input data stream.

FIG. 8 is a flow chart which illustrates a submethod which may be used within the insert bit pattern subroutine block of FIG. 4 to select and insert the appropriate bit pattern into the input data stream. The method initiates, as represented by start block 800, and a determination is made if the preamble pattern has been detected, as represented within a decision block 801. If the preamble pattern has been detected, then this causes the appropriate bit to be inserted into the data stream, as represented within an activity block 802. Otherwise, if the preamble pattern has not been detected, a determination is made if the flag which has been set is the null metric flag, as represented within a decision block 803. If the null metric flag has been set, then a bit pattern of "1100" is inserted into the data stream to break-up the null pattern, as represented within an activity block 804. The insertion of a data pattern of 1100 conveniently breaks up the null pattern, and also includes phase and amplitude information to provide for accurate phase and amplitude calibration. From the activity block 804, the method returns to the main method of FIG. 4.

If it is determined within the decision block 803 that the null metric flag has not been set, then a determination is made if the previous 2 bits in the data stream were "00," as represented within a decision block 805. If the last two bits were 00, then a bit pattern of 1100 is inserted into the data stream, as represented within an activity block 810, to produce a 6-bit pattern of "001100." However, if it is determined within the decision block 805 that the previous 2 data bits were not 00, then the method proceeds to determine if the last 2 bits were "01," as represented within a decision block 815. If the last 2 bits were 01, then a bit pattern of 1001 is inserted, as represented within an activity block 820, to produce a 6-bit data pattern of "011001." However, if the last 2 data bits in the data stream were not 01, then the method proceeds to a decision block 825, wherein a determination is made if the last 2 data bits were "10." If the last 2 data bits in the data stream were 10, then a data pattern of 0110 is inserted, as represented within an activity block 830, to produce a 6-bit data pattern of "100110." However, if the last 2 data bits were not 10, then this indicates that the last 2 data bits were 11, so that a data bit pattern of 0011 is inserted into the data stream, as represented within an activity block 840, to produce a 6-bit data pattern of "110011." It will be appreciated by those skilled in the art that the method of bit insertion described above ensures that maximum phase and amplitude information is inserted into the data stream to assist the phase locked loop and the AGC circuit so that phase lock and gain calibration are not lost.

Once the appropriate data bit pattern has been inserted within the activity blocks 810, 820, 830 or 840, then the method returns to the main method of FIG. 4, as represented within an activity block 850. In this manner, the method of the preferred embodiment ensures that the appropriate sufficient phase content will be inserted into the data stream to provide for accurate phase lock calibration. Furthermore, since the insertion of a 4-bit data pattern in accordance with the method of FIG. 8 will result in a maximum phase variation (i.e., $R_3-R_5=4$ or $-4$), and since this value is weighted so that a maximum phase variation will result in an even larger contribution to the moving average, one bit pattern insertion should be sufficient to raise the moving average well over the threshold level so that the bit pattern insertion obtains optimum phase content.

It can be appreciated that alternative bit insertions to those described above may also be effective. For example, it has been found suitable to use single bit insertion as well. In one implementation of this technique, the opposite bit of the bit prior to the last bit detected is inserted in response to the phase, AGC, and null metrics. If the preamble pattern is detected, the identical bit to the bit prior to the last bit detected is inserted. Other bit insertion schemes may also be used in response to the metrics described in conjunction with FIG. 8.

Figure 9:
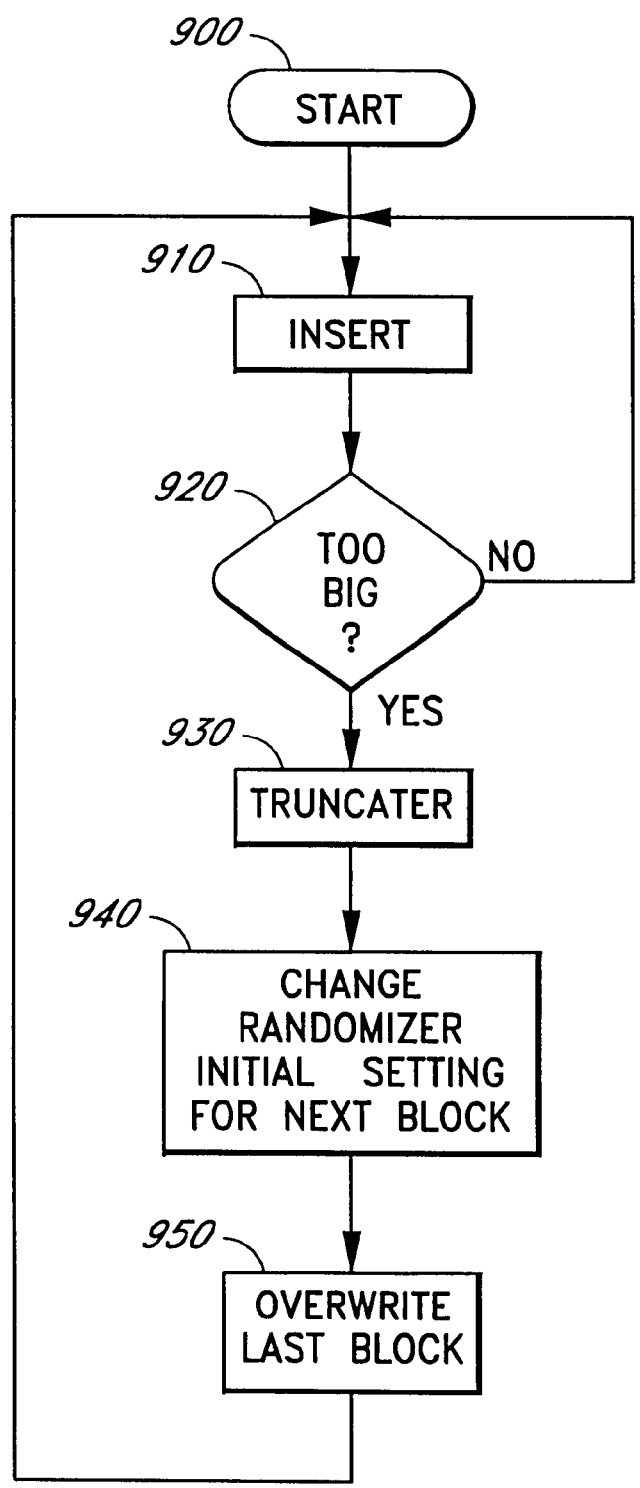
FIG. 9 is a flowchart that illustrates a general method used in accordance with the present invention to reconfigure the randomizer code when data is to be stored to a magnetic disk.

FIG. 9 is a flow chart which illustrates one embodiment of the general method used in accordance with the present invention to reconfigure the randomizer code when data is to be stored to a magnetic disk. The method initiates as represented within a start block 900 and thereafter, whenever a bit pattern is inserted into the data stream, as represented within an activity block 910, a determination is made whether the number of bits inserted is too large for a given block of data as represented within a decision block 920. In one embodiment, the number of insertions is tabulated, and if four times this number of insertions is greater than the number of bits which would cause the data block to be too large for storage onto the disk, a flag is set.

Thus, if it is determined that the number of insertions has not exceeded the threshold value, the method returns to the activity block 910 for tabulation of the next bit pattern insert. However, if it is determined that the threshold value has been exceeded within the decision block 920, the method proceeds to truncate the last data block as represented within an activity block 930. That is, the data block which is written to the disc is truncated so as not to exceed the sector size to which the data block is written. Thereafter, the randomizer code for the next data block to be randomized are changed, as represented within activity block 940. In one advantageous embodiment, each of the possible different randomizer codes ($2^n-1$ possibilities for an n-bit code) results in an orthogonal pseudo-noise code to that which was used on the last block of data. The reconfiguration to an orthogonal code ensures that the next block of data will not have a high correlation with the new pseudo-noise code. This is because, orthogonal codes have an essentially zero correlation with one another so that, assuming that consecutive blocks of data have essentially the same bit pattern characteristic, when a bit pattern has a high correlation with a given pseudo-noise code, the same pattern will have a low correlation with a pseudo-noise code orthogonal to the original pseudo-noise code. Thus, by changing the randomizer code for the next block of data so that the new pseudo-noise code is orthogonal to the last pseudo-noise code, the number of insertions for the data bit stream can always be reduced beneath the threshold required for storage onto the disk.

In one preferred embodiment, the randomizing polynomial used to generate the family of pseudo-noise codes used to randomize the data stream is:

$$g(x)=x^{24}+x^{21}+x^{19}+x^{18}+x^{17}+x^{16}+x^{15}x^{14}+x^{13}+x^{10}+x^9+x^4+x^3+x+1$$

Finally, after the randomizer initial setting has been changed, the last block of data, for which a number of insertions was too high, is overwritten using the new pseudo-noise code as represented within an activity block 950. All subsequent data blocks are also randomized using the new pseudo-noise code. It should be noted that in the case of the disk storage, it is possible to change the randomizer code on the fly and to overwrite the last data block because of the characteristics of a disk storage media which allow for overwrite on the fly. Thus, in accordance with the method of FIG. 9, data can be written to a disk drive without the danger that such data will be too large for storage purposes since changing of the randomizer code on the fly will ensure that the percent increase for a given data block will never exceed the sector space allocated for storage to the magnetic disk.

Figure 10:
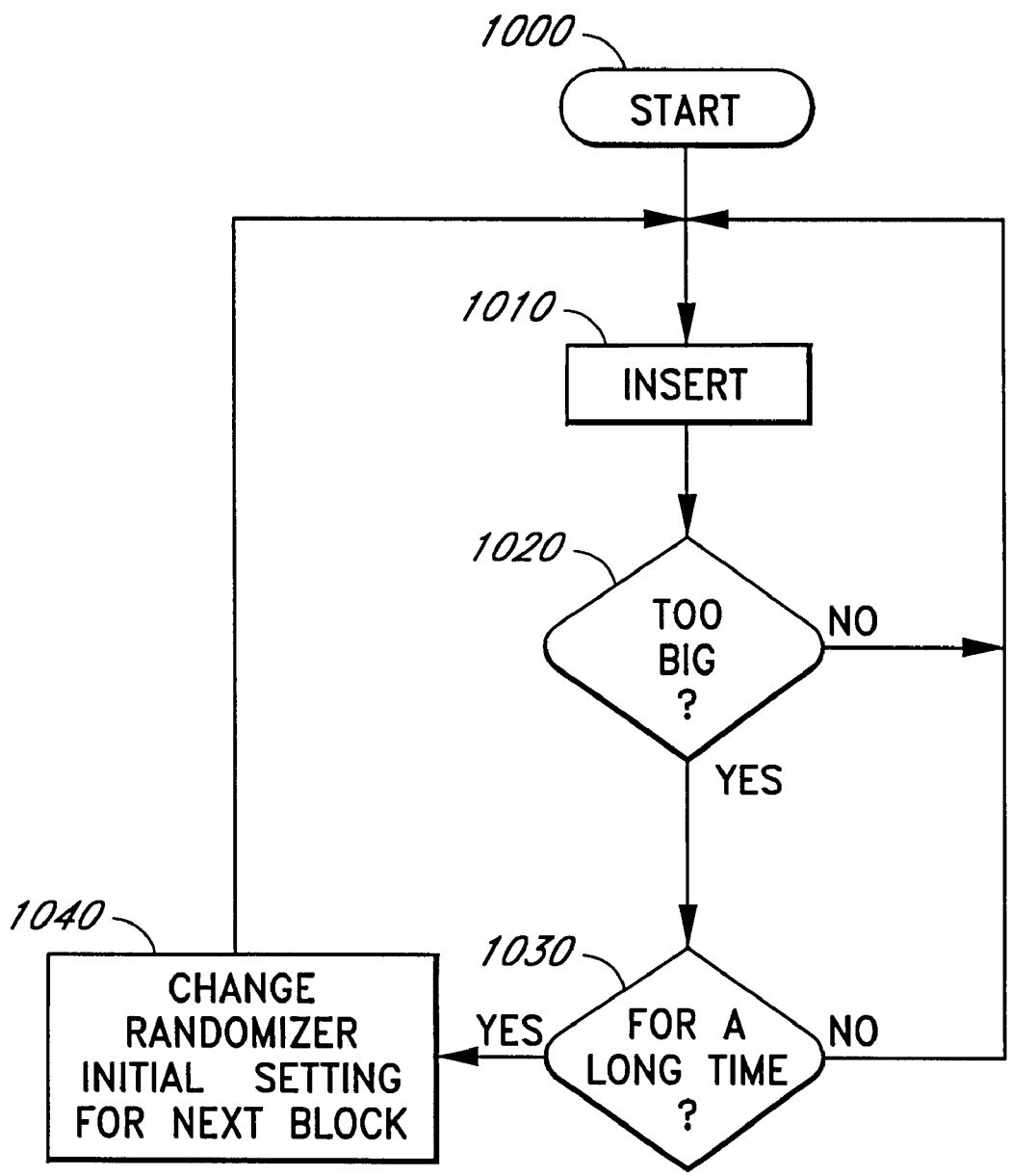
FIG. 10 is a flowchart that illustrates the overall method used in accordance with the present invention to reconfigure the randomizer code when the data storage media written to is a magnetic tape.

FIG. 10 is a flow chart which illustrates one embodiment of the overall method used in accordance with the present invention to reconfigure the randomizer code when the data storage media written to is a magnetic tape. The method initiates as represented within a start block 1000, and thereafter, any bit insertions into the data stream are tabulated as represented within an activity block 1010. If it is determined that the number of insertions for a given data block is within the allowable limits, as represented within a decision block 1020, then the method returns to the activity block 1010 to await the next insertion. However, if it is determined within the decision block 1020 that the number of insertions has exceeded the allowable threshold level, then a further determination is made within a decision block 1030 if the number of insertions is too large for one or more blocks of data. In one advantageous embodiment, one block of data is monitored before it is determined that the number of insertions has been excessive for too long of a time, however two, three or more blocks could also be monitored as called for by the particular application. If a number of insertions has not been excessive for too long of a period, then the method returns to the activity block 1010. However, if it is determined within the decision block 1030 that the number of insertions has been too large for too long of a time, then the randomizer code is changed for the next block as represented within an activity block 1040. The method employed within the activity block 1040 is substantially identical to the method employed within the activity block 940 of FIG. 9.

After the randomizer code has been changed for the next data block, the method returns to the activity block 1010 to continue monitoring of the number of inserts into the data stream. In this manner, the preferred embodiment ensures that the number of bit insertions into data to be stored onto a magnetic tape does not increase the size of the data to be stored above a tolerable limit (e.g., 1%).

Figure 11:
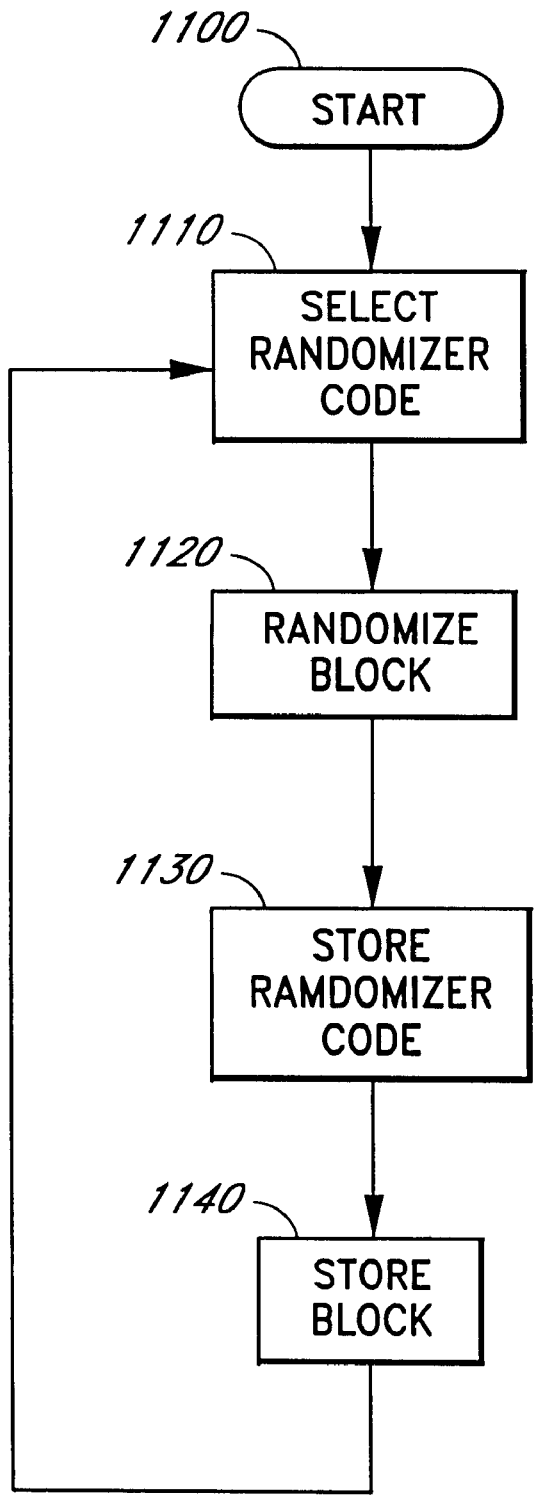
FIG. 11 is a flowchart illustrating one embodiment of a method which may be used in accordance with the present invention when the data storage media written to is either magnetic disk or magnetic tape.

FIG. 11 is a flow chart which illustrates an alternative method used in accordance with the present invention to reconfigure the randomizer code. In this case, the data storage media written to may be either magnetic tape or disk. The method initiates as represented within a start block 1100. At step 1110, when data is to be written to a magnetic media such as a disk or tape, a randomizer code is selected with which to randomize the block to be written. As mentioned above, this selection is preferably performed in a non-deterministic manner. As represented by block 1120, the block is randomized with this randomizer code. When writing the data block to the media, at block 1130 the randomizer code is stored, typically in a header portion of the data block. Also, at step 1140, the data itself is stored on the media. After this data block is written, the system loops back to step 1110, and selects a new randomizer code for use with the next data block. Once again, the selection is preferably performed in a non-deterministic manner. Each data block is therefore randomized with a different randomizer code, and the respective randomizer codes are stored on the media with the data itself. With this method, it is not necessary to include hardware for monitoring the number of bit insertions as described in conjunction with FIGS. 9 and 10. Non-deterministic selection of the randomizer code for each data block ensures that only an insignificant number of data blocks will require excessive bit insertions during a variable rate encoding process. It may also be noted that in this embodiment, it is not necessary to ensure that the randomizer code used for one particular block be different from the code used to randomize the prior block. With non-deterministic selection of a 24 bit randomizer code, identical randomizers for adjacent blocks will only occur about once every 16 million blocks.

It will also be appreciated by those of ordinary skill in the art that the steps of randomizing the block 1420, storing the randomizer code 1130, and storing the block 1140 may be performed in any order. In many embodiments, data block randomization and storage are performed concurrently, as the data is stored as the randomized bits of the block are serially output from the randomizer.

It should be noted that it is advantageous to be able to store data patterns which have been deliberately designed to anticipate changes in the randomizing sequence output by the pseudo-random code generator 205 (i.e., with the specific intent of producing a degenerate pattern). Thus, if a deterministic method of changing to new randomizer codes is used, it is still possible that such data streams will require an unacceptable number of bit insertions. Because the code bit sequence is not practically predictable with non-deterministic randomizer code selection, data streams which are intentionally encoded to frustrate data storage may still be randomized in such a way so as to reduce the average number of bit insertions per block to a tolerable level.

Another alternative is available for preventing the storage of data with excessive insertions. The data pattern can be simultaneously fed to several encoder circuits, each using a different randomizer code. The output of the encoders is be routed to a buffer memory, where the randomized and encoded data block requiring the fewest insertions is selected for writing to the media, while the rest of the data blocks are discarded. It will be appreciated that when several randomized and encoded data sets are created, many alternative methods of selecting between them may be used. One alternative mentioned above is the selection of the data block incorporating the fewest insertions. Alternatively, one encoder may be a "primary" source of randomized and encoded data, unless the number of insertions exceeds a particular threshold, in which case a secondary encoder output is selected for writing to the media. If this secondary encoder output also includes excessive insertions, a third encoder output can be selected, and so on, until a data block of suitable length is found. The circuitry required to implement this scheme for, for example, four independent, alternative encoders is quite inexpensive. In this embodiment, non-deterministic selection of the plurality of randomizer codes is unnecessary. Rather, a plurality of fixed randomizer codes may be used. Data patterns which require an unacceptably high insertion rate for all randomizer codes used, occur with a negligible frequency. It will be appreciated that periodic non-deterministic selection of new randomizer codes may also be performed with the multiple encoder embodiment. In this case, of course, the same microcontroller may be utilized to periodically generate all of the alternative randomizer codes.

FIG. 12 schematically illustrates a format of a data block in one preferred embodiment of the invention. The overall block format is application specific. Each block preferably consists of a series of framed sub-blocks containing an interleaved series of systematic Reed-Solomon code words. Error correction is based primarily on erasures. This is efficient and uses a low bandwidth.

As shown in FIG. 12, each data block includes a preamble, a header, a data portion, a cyclical redundancy check (CRC) portion and a postamble. The preamble typically comprises a four-byte segment which is used to identify the beginning of a new data block, and is advantageously not encoded with the pseudo-noise code so that it is not necessary to know the pseudo-noise code in order to detect the preamble segment. In one actual embodiment, the preamble is "01001100110011001100110011001111."

The header segment contains initialization for the data segment scrambler, as well as other information. It is preferably a three byte sequence which is sent to the shared memory resource by the microcontroller 120 for each 512 bytes data block received by the shared memory resource from the host. The header field therefore preferably consists of the first three bytes received by the encoder from the direct memory access (DMA) channel. Prior to recording, the header is randomized using a fixed randomizer code (i.e., seed). Because the header is randomized using a fixed seed which is always available to the decoder 130, the header randomization may result in a header sequence with poor read characteristics. For instance, the fixed header randomizer may produce a header which contains a long string of zeros. Because re-randomization is unavailable for the header field, it is preferable to use a different encoding scheme for the header field than the data field. For example, the header could be encoded using a fixed 4/5 or 8/9 code. This is less efficient than the variable rate insertion code used on the data block, but it provides a better assurance of readability in the absence of re-randomization. As a preferable alternative, the variable rate bit insertion can be performed on the header, but with different bit insertion thresholds for null sequence length, phase content, and amplitude variations than are utilized when writing the data field to better ensure adequate read characteristics for the header field.

The randomizer initialization is preferably identical for all sub-blocks in a physical frame. Because of read while write error correction, sub-blocks may be associated with a track or frame different from the physical track or frame they are recorded in. Thus, information used to compensate for this effect is included within the header. The data field contains data which has been encoded using the randomizing polynomial and randomizer code. This data field includes the last 512 bytes from the DMA channel.

The CRC segment advantageously comprises a six byte field calculated from the preceding header and data fields after the randomization. This sub-block is never randomized and allows a sub-block to be validated without knowledge of the randomizer initialization In one preferred embodiment, the polynomial used to calculate the CRC field is:

$$g(x)=x^{48}+x^{46}+x^{44}+x^{42}+x^{36}+x^{34}+x^{33}+x^{32}+x^{31}+x^{30}+x^{28}+x^{26}+x^{25}+x^{24}+x^{23}+x^{22}+x^{21}+x^{20}+x^{19}+x^{17}+x^{13}+x^{10}+x^{9}+x^{6}+x^{4}+x^{2}+x+1$$

The postamble field advantageously comprises a four-bit pattern such as 0101.

Figure 13:
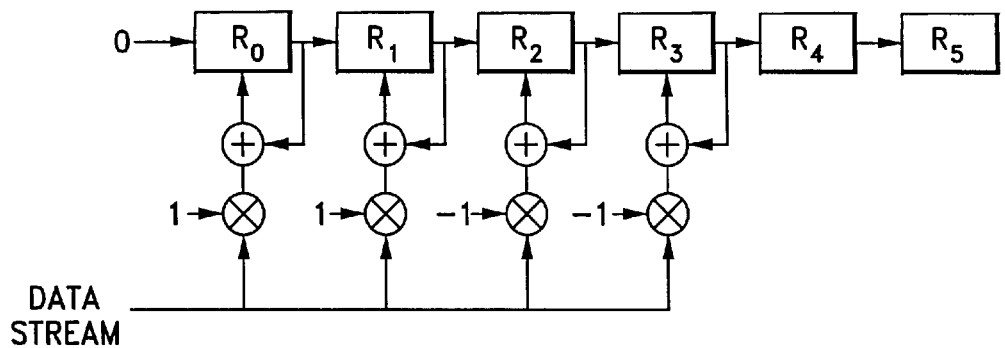
FIGS. 13–13d schematically illustrate the method used within a convolutional encoder to simulate the read-head impulse response in order to determine the null, phase, and automatic gain control metrics.
Figure 13A:
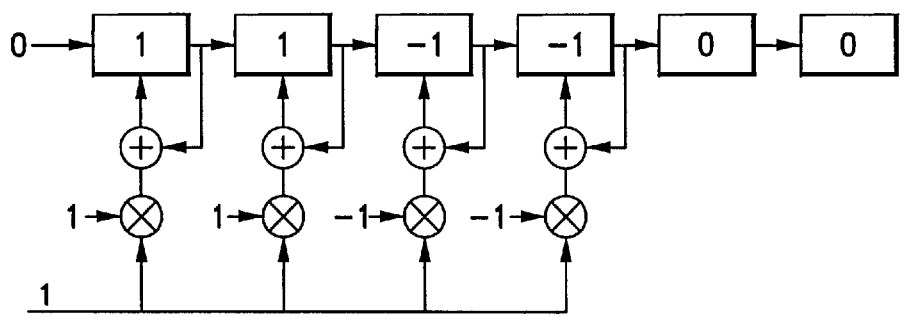
Figure 13B:
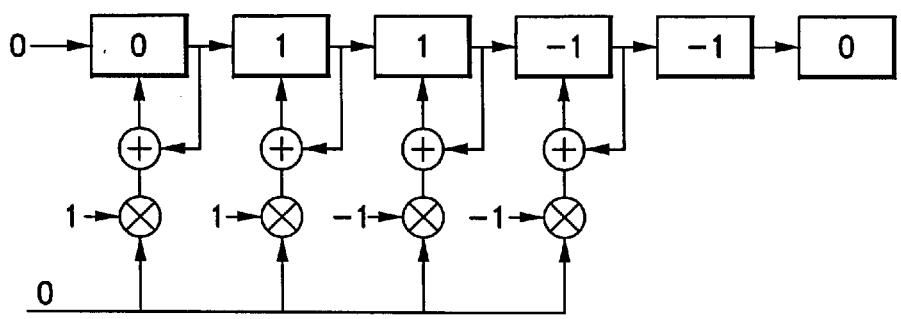
Figure 13C:
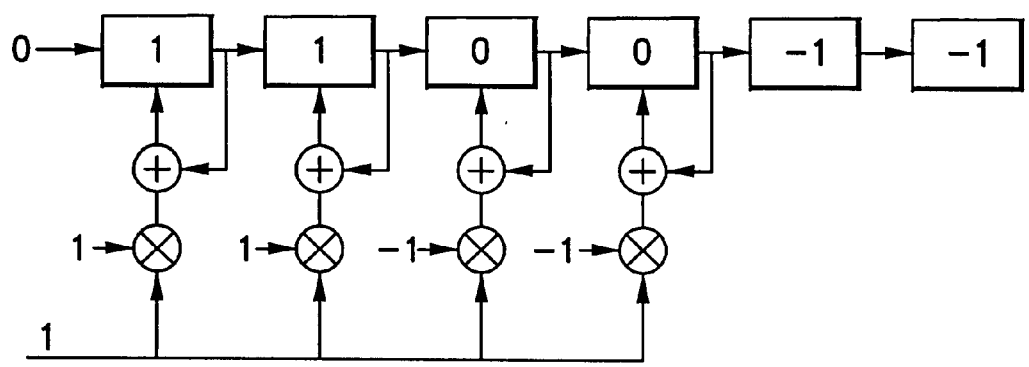
Figure 13D:
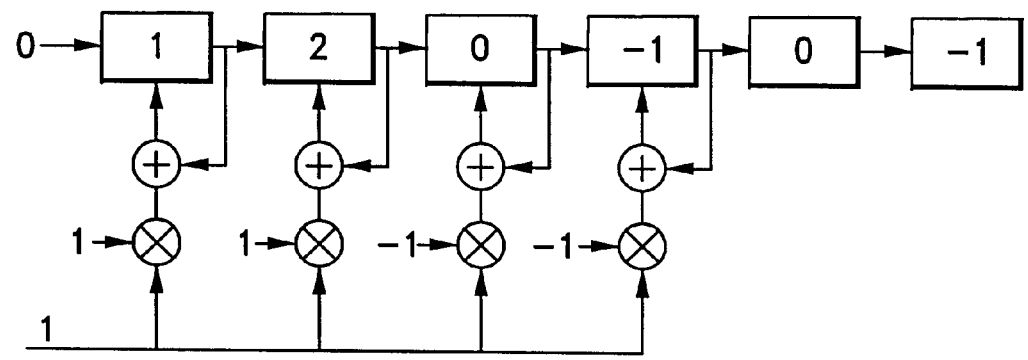

FIGS. 13–13d schematically illustrate the method used within a convolutional encoder to simulate the read head impulse response in order to determine the null, phase, and AGC metrics. In order to determine whether or not the read head used to read the data from the magnetic media is receiving sufficient amplitude and phase information, it is important to simulate the effects of the read head using a partial response simulation method. In the particular implementation used in the preferred embodiment, the extended partial response, class 4 (EPR4) is simulated since the simulation using this method is closest to the actual response observed in the read head used in the preferred embodiment.

As depicted in FIG. 13, a data stream is input into a parallel multiplier circuit wherein each bit of the data stream is simultaneously multiplied by either a positive one or a negative one. As depicted in FIG. 13, a bit from the data stream is multiplied by a positive 1 and then added to the value within a register $R_0$, while the same bit is multiplied by 1 and added to the value stored within a register element $R_1$. The same data bit is also multiplied by a $-1$ to be added to the value stored within the register elements $R_2$ and $R_3$, respectively. Upon each clock cycle, the value stored within the shift register elements are shifted over by 1 bit so that a convolutional encoding is performed to simulate the read head impulse response.

For example, as depicted in FIG. 13a–13d, assuming that the register elements $R_0$–$R_5$ are initialized to 0, when the first bit in the data stream is received, register elements $R_0$–$R_5$ will respectively have values of 1, 1, $-1$, $-1$, 0, and 0, as depicted in FIG. 13a. Subsequently, the values within the shift register elements $R_0$–$R_5$ are shifted by one element so that $R_0$ is equal to 0, $R_1$ is equal to 1, $R_2$ is equal to 1, $R_3$ is equal to $-1$, $R_4$ is equal to $-1$, and $R_5$ is equal to 0.

Thereafter, when the next data bit in the data stream is applied, (e.g., a 0 as shown in FIG. 13b), this value is multiplied by the appropriate multiplier value and added to the value stored within the shift register elements $R_0$–$R_5$. Because the data stream value is 0 as shown in the example of FIG. 13b, this does not change the value of any of the bits stored within the shift register elements $R_0$–$R_5$.

However, in the next clock cycle the data bits are shifted once again and the next bit in the data stream is then multiplied by the appropriate multiplier values and added to the respective values within the shift register elements $R_0$–$R_3$. As depicted in FIG. 13c, when a 1 is applied in the next clock cycle, this causes a value of 1 to be added to the 0 value stored within the shift register element $R_0$, while a value of 1 is also added to the 0 value stored within the shift register element $R_1$. Furthermore, values of $-1$ are added to the values stored within the shift register elements $R_2$ and $R_3$ thereby resulting in a net 0 value to be stored within the shift register elements $R_2$ and $R_3$. Finally, the shift register elements $R_4$ and $R_5$ include the shifted values of $-1$ and $-1$, respectively.

Once again, these values are shifted by one element (so that $R_0$–$R_5$ are now equal to 0, 1, 1, 0, 0, $-1$, respectively) and the next bit in the data stream is multiplied by the appropriate factor and added to the shift register elements $R_0$–$R_3$. The subsequent multiplication and addition to the value stored within the shift register elements $R_0$–$R_3$ results in values of 1, 2, 0, $-1$, 0, and $-1$ to be stored within the shift register elements $R_0$–$R_5$, respectively.

As will be appreciated from the above-described method, whenever a long stream of consecutive zeros is input as the data stream, this will eventually cause the register value of $R_3$ to assume a value of 0 for an extended number of clock cycles. Thus, the value stored within register $R_3$ is indicative of a null within the data stream. Furthermore, it will also be appreciated that the value of $R_3$ is indicative of gain content so that the value of $R_3$ will become a $+2$ or a $-2$ whenever a large amplitude variation is observed in the data stream. Thus, whenever a value of 2 or $-2$ has not appeared within the register element $R_3$ for an extended period of time, this indicates that the data stream is devoid of amplitude information so that a bit pattern which adds amplitude information must be inserted as described above. Finally, it will be appreciated that since the value stored within register element $R_5$ is simply a time delayed version of the value stored within register element $R_3$, the difference between the value stored within the register elements $R_3$ and $R_5$ taken during the same clock cycle will be indicative of the "slope" of the impulse response produced by the data stream at time $R_4$. Thus, the difference between the value stored within the register element $R_5$ and the value stored within the register element $R_3$ is a measure of the phase content, where a large difference indicates a high phase content and a small difference indicates a low phase content.

Although the preferred embodiment has been described in detail above, it will be appreciated by one of ordinary skill in the art that certain obvious modifications could be made to the preferred embodiment without departing from the spirit or central characteristics of the invention. For example, the insertion counter could be implemented as a device which monitors overall block size or the ratio of inserted bits to non-inserted bits. Therefore the scope of the invention should be interpreted in light of the following appended claims.

What is claimed is:

1. A tape drive comprising:
   a data encoder comprising a non-deterministic randomizer code generator;
   a recording head having read and write portions, wherein said write portion is coupled to an output of said data encoder; and
   a partial response decoder coupled to an output of said read portion of said recording head.

2. The tape drive of claim 1, wherein said recording head is configured to write to and read from linear recording tracks extending longitudinally along a segment of tape.

3. A data storage system comprising:
a tape drive;
a tape cartridge configured to be written to and read from by said tape drive;
means for non-deterministically generating randomizer codes for randomizing data to be written to said tape cartridge by said tape drive; and
means for writing said randomizer codes to said tape cartridge.

4. The data storage system of claim 3, additionally comprising means for reading data and randomizer codes from said tape cartridge.

5. The data storage system of claim 3, wherein said means for reading data and randomizer codes from said tape cartridge comprises an EPR4 partial response decoder circuit.

* * * * *